(12) United States Patent
MacGregor (10) Patent No.: US 7,023,702 B2
(45) Date of Patent: Apr. 4, 2006

(54) APPARATUS INCLUDING CIRCUIT BOARD AND HEAT SINK AND METHOD OF MAKING THE APPARATUS

(75) Inventor: Mike G. MacGregor, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 312 days.

(21) Appl. No.: 10/681,920

(22) Filed: Oct. 9, 2003

(65) Prior Publication Data

US 2005/0078455 A1   Apr. 14, 2005

(51) Int. Cl.
*H05K 7/20* (2006.01)
(52) U.S. Cl. ............... 361/719; 165/80.3; 165/185; 257/719; 361/704
(58) Field of Classification Search ........... 165/80.3, 165/185; 257/718–719, 726–727; 361/704, 361/707, 710, 719–720
See application file for complete search history.

(56) References Cited

U.S. PATENT DOCUMENTS

| 4,321,423 | A | * | 3/1982 | Johnson et al. ............ 174/16.3 |
| 4,446,504 | A | * | 5/1984 | Jordan et al. ............... 361/715 |
| 4,546,408 | A | * | 10/1985 | Rodseth et al. ............. 361/720 |
| 4,652,971 | A | * | 3/1987 | Peterson et al. ............ 361/720 |
| 5,901,039 | A | * | 5/1999 | Dehaine et al. ............. 361/704 |
| 6,095,701 | A | * | 8/2000 | Sattler .................... 400/120.17 |

\* cited by examiner

*Primary Examiner*—Gregory D. Thompson
(74) *Attorney, Agent, or Firm*—Buckley, Maschoff & Talwalkar LLC (57) ABSTRACT

In some embodiments, an apparatus includes a circuit board, a plurality of metal inserts, and a heat sink having a plurality of mounting holes. Each of the metal inserts may include at least one lower member soldered to the circuit board, and an upper portion received in a respective one of the mounting holes of the heat sink and secured to the respective one of the mounting holes by a respective fastener.

23 Claims, 13 Drawing Sheets

APPARATUS INCLUDING CIRCUIT BOARD AND HEAT SINK AND METHOD OF MAKING THE APPARATUS

BACKGROUND

Many integrated circuits generate heat that must be dissipated by a cooling arrangement such as a heat sink that is thermally coupled to the integrated circuit. As integrated circuits have advanced and become more complex, the amount of heat to be dissipated has increased, leading to an increase in size of the heat sinks employed to cool integrated circuits. The increase in size of heat sinks may compromise typical techniques used to mount heat sinks on circuit boards that carry the integrated circuits to be cooled.

DETAILED DESCRIPTION

Figure 1:
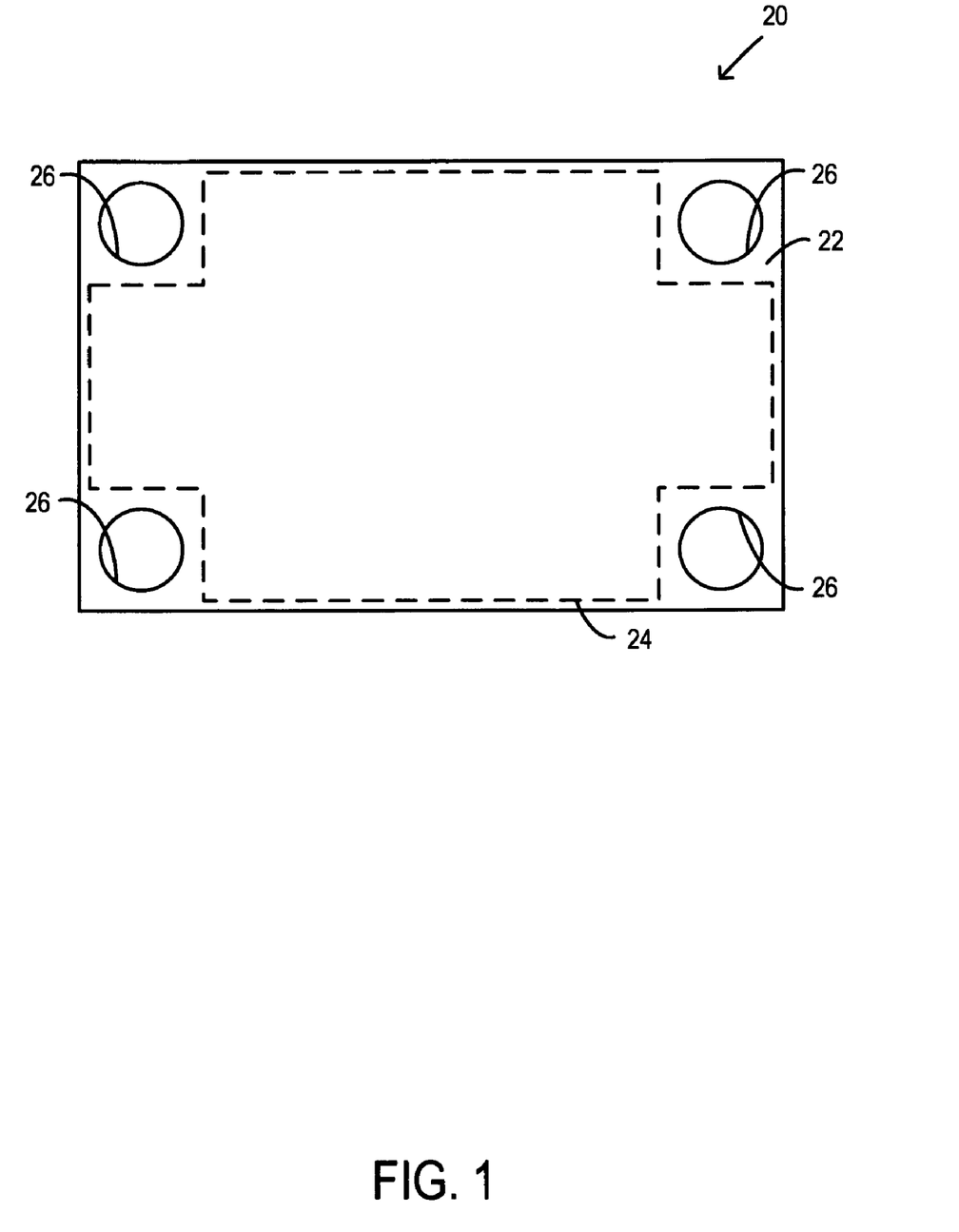
FIG. 1 is a schematic plan view of a heat sink provided according to some embodiments.

FIG. 1 is a schematic plan view of a heat sink 20 provided according to some embodiments. The heat sink 20 includes a base 22 on which a heat dissipation structure (indicated in phantom at 24) is supported. (For example, the heat dissipation structure 24 may take the form of fins 25 shown in FIG. 5. Other configurations of a heat dissipation structure may be employed.) Continuing to refer to FIG. 1, mounting holes 26 (e.g. four mounting holes) are provided at corners of the base 22 of the heat sink 20. The heat sink 20 may be composed of any suitable heat conducting and dissipating structure, including, for example, copper fins on a copper base. Additionally or alternatively, the heat sink 20 may include other components such as active components that may include a fan and/or a vapor chamber.

Figure 2:
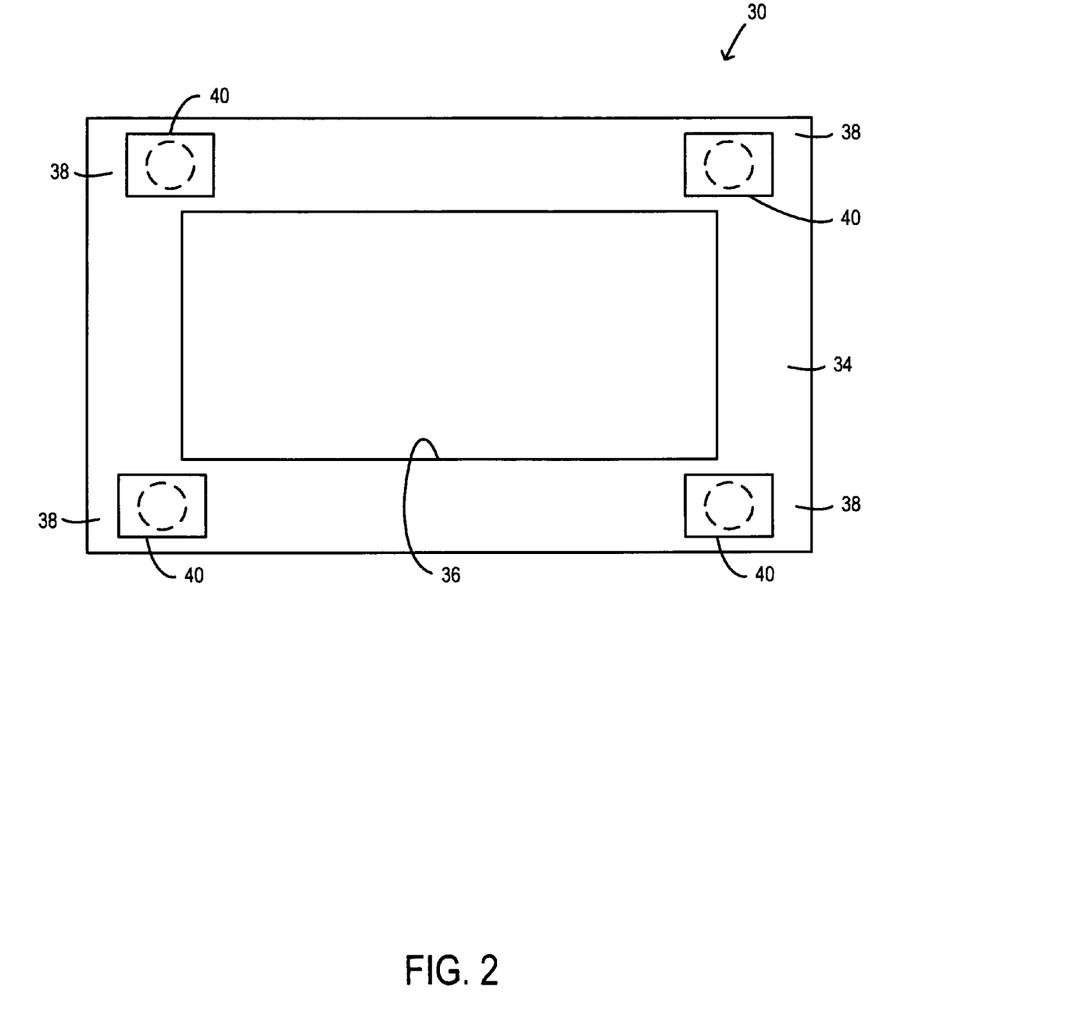
FIG. 2 is schematic plan view of an attachment assembly provided according to some embodiments for use in mounting the heat sink of FIG. 1 to a circuit board.
Figure 5:
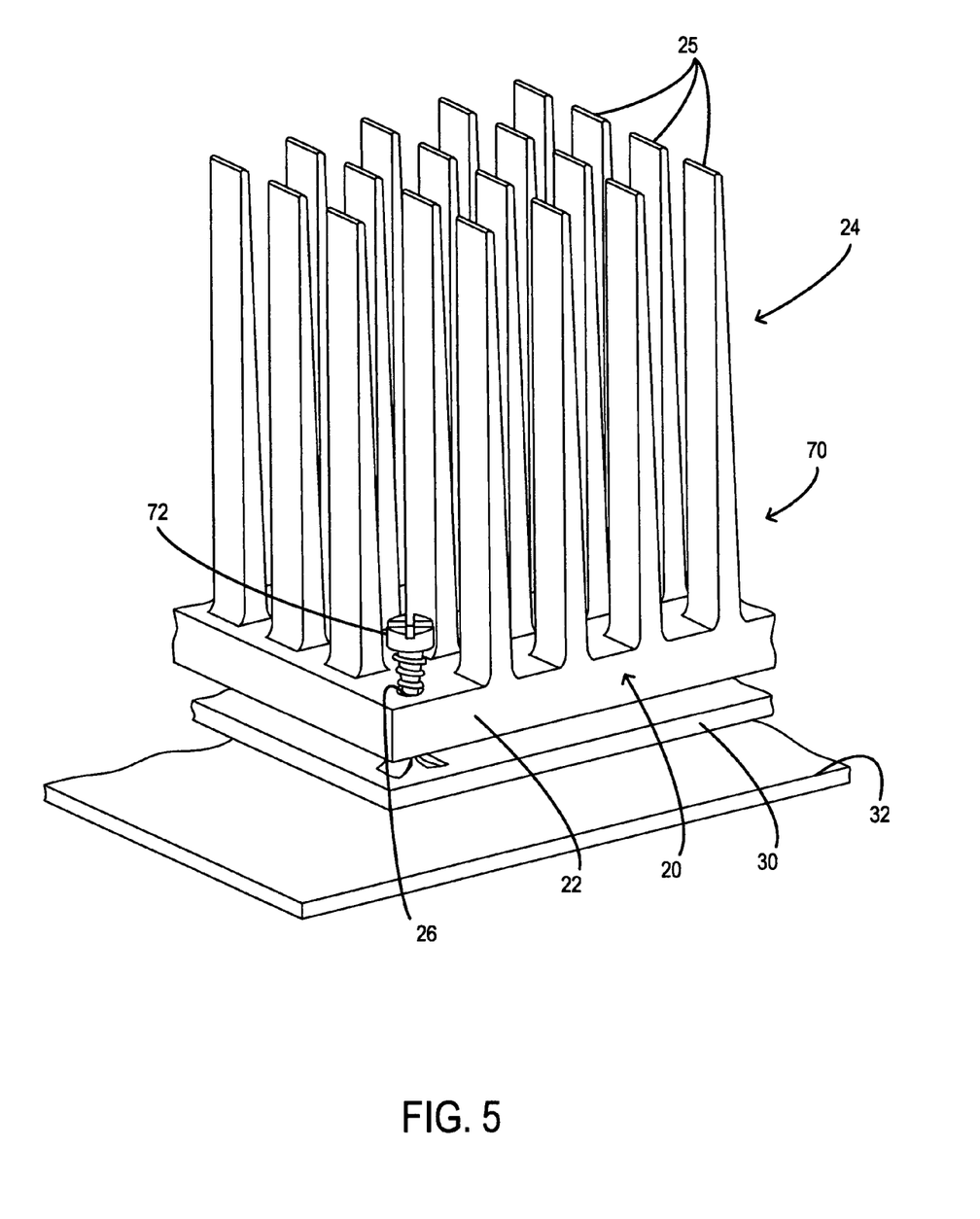
FIG. 5 is a partial, isometric, partially exploded view showing an apparatus that includes the heat sink of FIG. 1 and the attachment assembly of FIG. 2.

FIG. 2 is a schematic plan view of an attachment assembly 30 provided according to some embodiments for use in mounting the heat sink 20 to a circuit board (e.g. the circuit board 32 indicated in FIG. 5). Continuing to refer to FIG. 2, the attachment assembly 30 may include a plastic frame 34, which may be substantially rectangular, e.g. in the form of a hollow rectangle, which includes a central, substantially rectangular opening 36. The plastic frame 34 has corners 38 at which metal inserts (schematically indicated at 40 in FIG. 2) are mounted.

Figure 3:
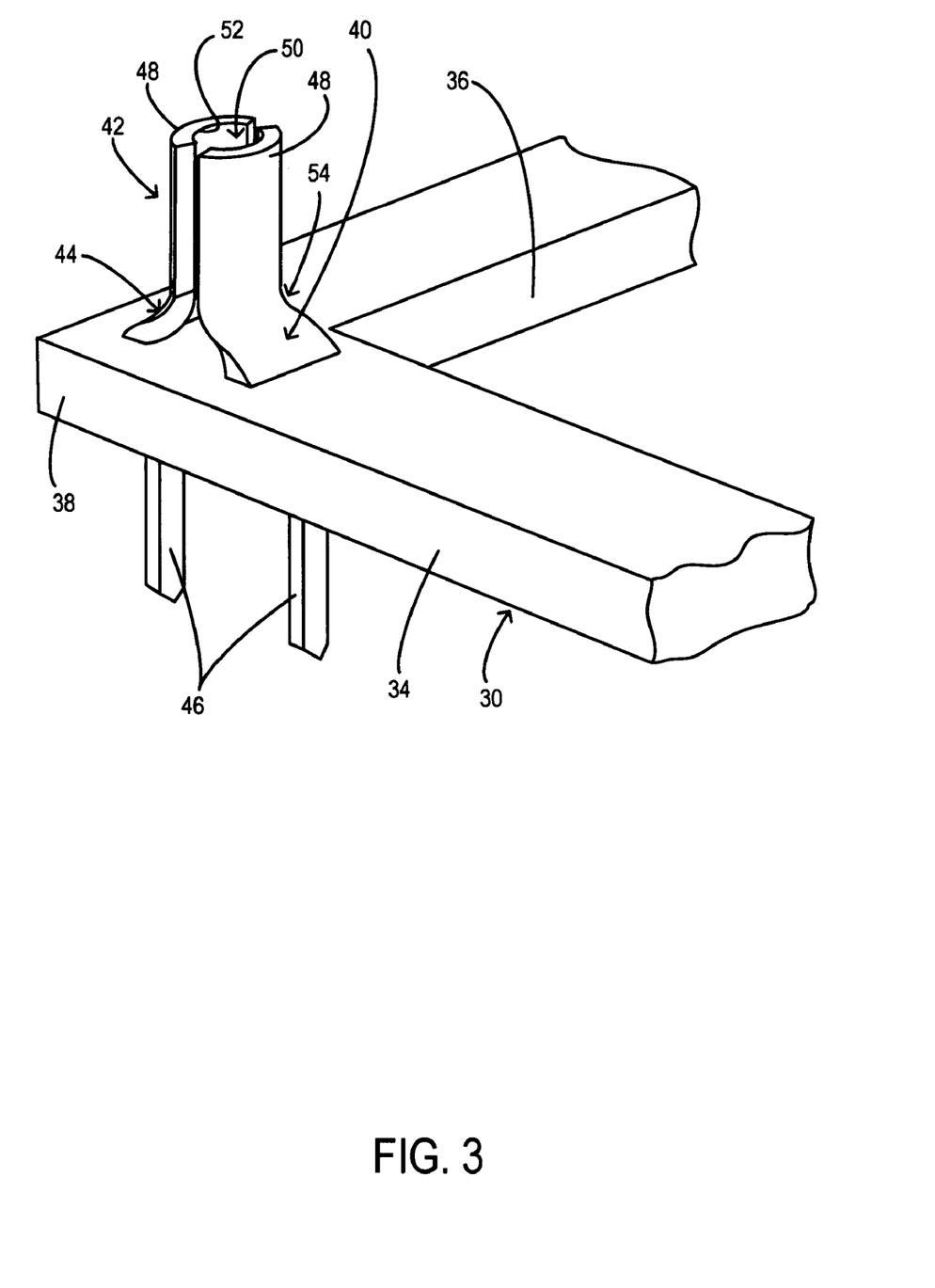
FIG. 3 is an isometric view, taken from above, of a portion of the attachment assembly of FIG. 2.
Figure 4:
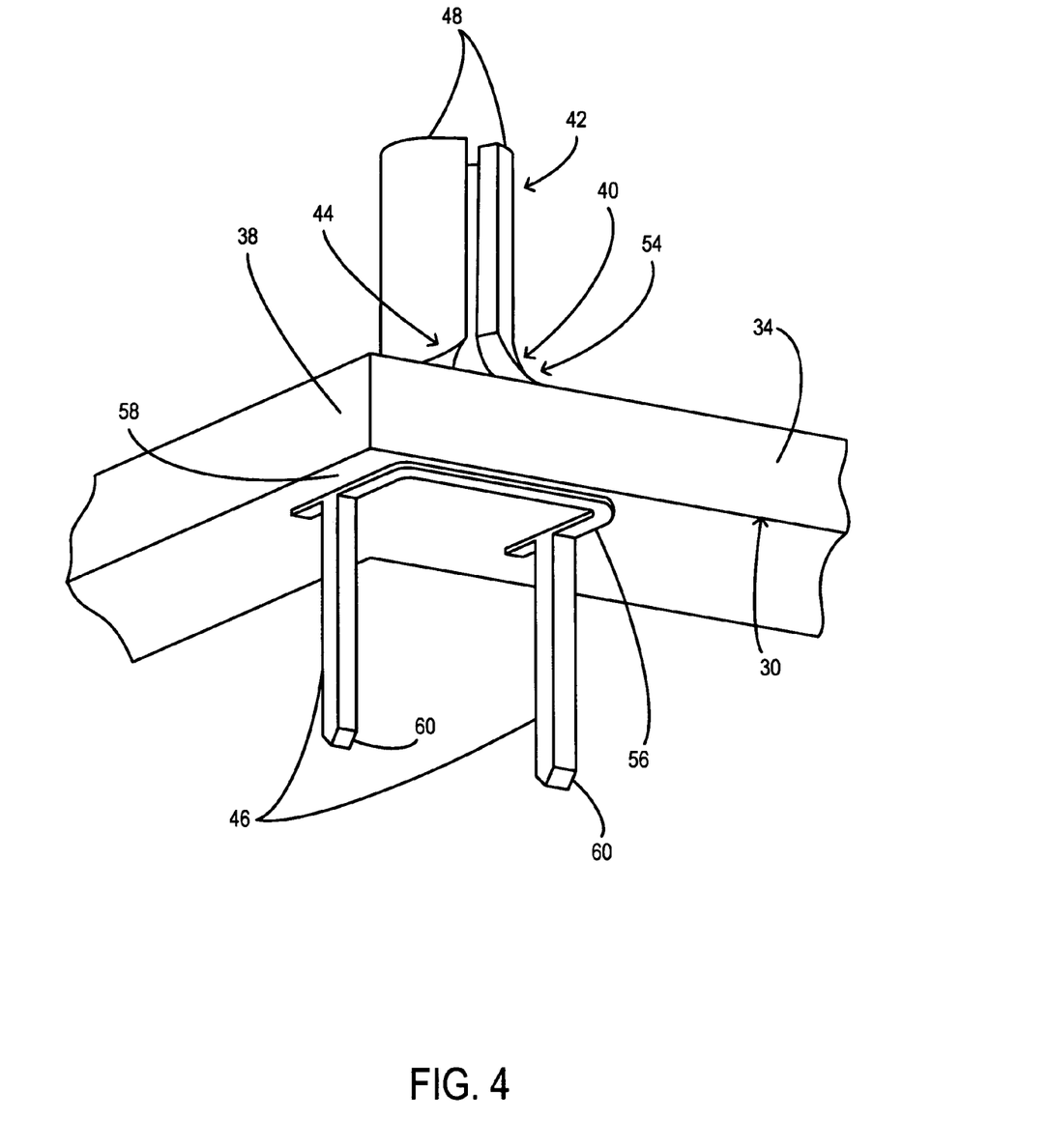
FIG. 4 is an isometric view, taken from below, of a portion of the attachment assembly of FIG. 2.

FIG. 3 is an isometric view, taken from above, showing details of one of the metal inserts 40 mounted at one of the corners 38 of the plastic frame 34 of the attachment assembly 30. FIG. 4 is an isometric view, taken from below, showing the metal insert 40 and the 38 of the plastic frame 34. As seen from FIGS. 3 and 4, the metal insert 40 (all of the inserts 40 may be identical), includes an upper portion 42, a middle portion 44 and a pair of lower members 46. The upper portion 42 may include a pair of barrel segments 48 which face each other (i.e., have their respective concave surfaces facing each other) to define a substantially cylindrical space 50 (FIG. 3) having an open end defining a substantially circular opening 52. The cylindrical space 50 is oriented so as to have its central axis (not indicated) in a vertical orientation.

The middle portion 44 of the metal insert 40 flares outwardly and downwardly, as indicated at 54, to form a bracket 56 (FIG. 4) from which the lower members 46 extend downwardly. The bracket 56 may generally take the form of three sides of a rectangle, as seen from FIG. 4. The bracket 56 may emerge a short distance downwardly from a lower surface 58 of the corner 38 of the plastic frame 34.

The metal inserts 40 may be mounted in the plastic frame 34 by the middle portions 44 of the metal inserts 40. For example, the middle portions 44 of the metal inserts 40 may be embedded in the plastic frame 34 at the corners 38 of the plastic frame 34, with the upper portions 42 of the metal inserts 40 extending upwardly from the plastic frame 34 and the lower members 46 of the metal inserts 40 extending downwardly from the plastic frame 34.

The lower members 46 may each be pin-shaped and may have tapered tips 60.

The plastic frame 34 may be formed of a number of different materials, including, for example, liquid crystal polymer (LCP) or polycarbonate, or another plastic material that has suitable thermal resistance to allow for the soldering of the metal inserts 40, as described below. The plastic frame 34 may be formed by molding around the metal inserts 40 so as to embed at least partially the middle portions 44 of the metal inserts 40 in the plastic frame 34.

Each metal insert 40 may be a unitary body formed of a suitable metal such as brass. The metal inserts 40 may be at least partially plated with tin (e.g., at the lower members 46) to aid in wetting the metal inserts 40 during soldering. In other embodiments, the metal inserts may be formed of copper or a tin-plated metal other than brass.

Figure 6:
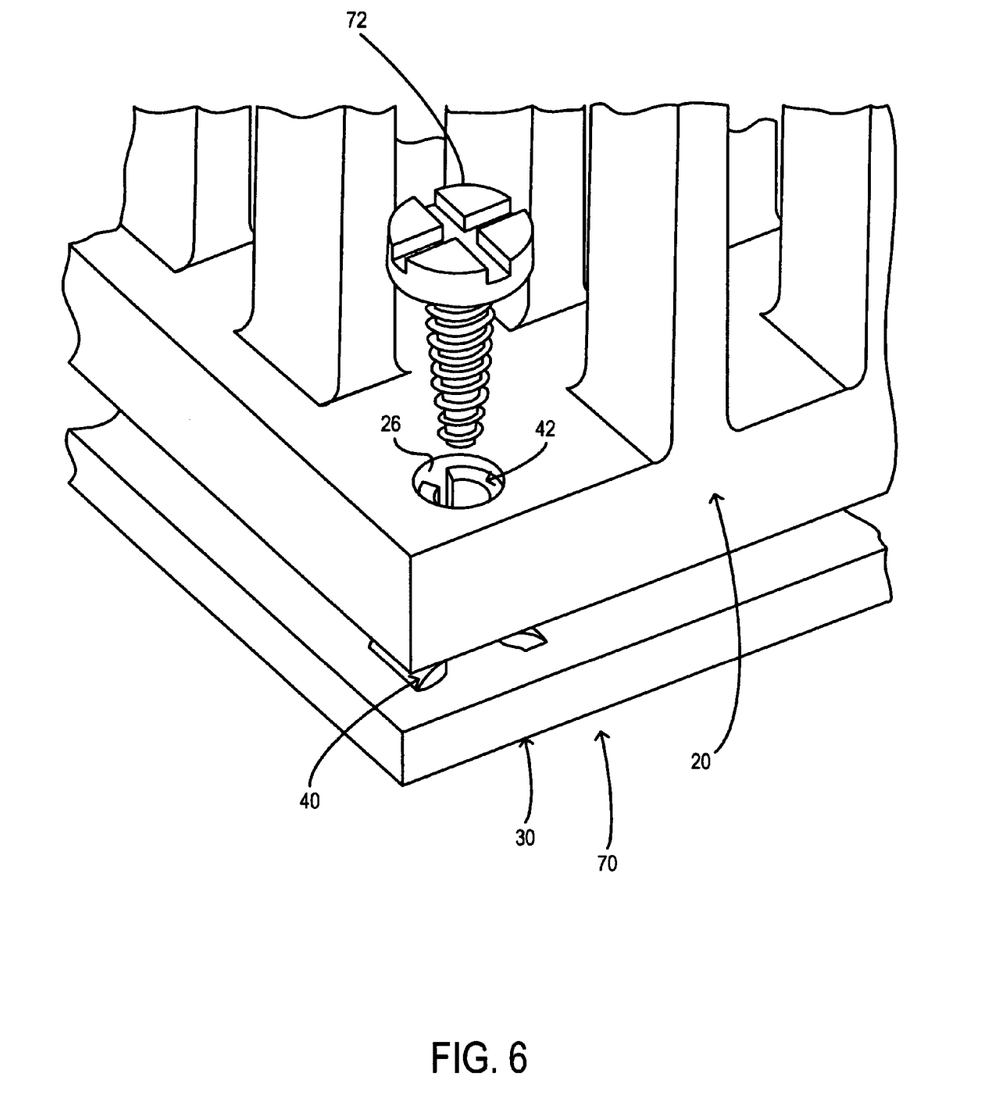
FIG. 6 is an isometric, partially exploded view showing some details of the apparatus of FIG. 5.

FIG. 5 is a partial, isometric, partially exploded view showing an apparatus 70 formed by installing the heat sink 20 on the circuit board 32 via the attachment assembly 30. FIG. 5 shows one corner of the heat sink 20 and indicates in part how the heat sink 20 is mounted on the circuit board 32. FIG. 6 is an isometric, partially exploded view showing some details of the apparatus 70 at the corner of the heat sink 20 on a larger scale than FIG. 5. Referring to FIG. 6, the upper portion 42 of the metal insert 40 is received in a mounting hole 26 of the heat sink 20. A fastener 72 is provided to secure the upper portion 42 of the metal insert 40 to the mounting hole 26 of the heat sink 20. For example, the fastener 72, as illustrated, may be a tapered pan head screw with suitable threading to produce threads in the inner (concave) surfaces of the barrel segments 48 which make up the upper portion 42 of the metal insert 40.

Figure 7:
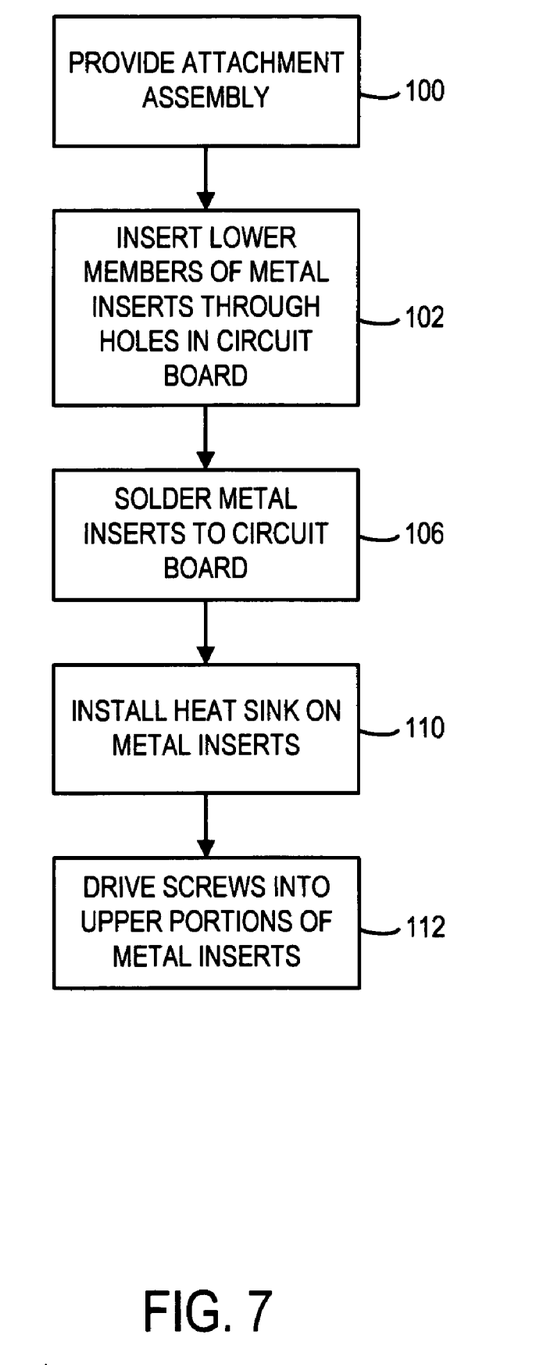
FIG. 7 is a flow chart that illustrates a process for assembling the apparatus of FIG. 5 according to some embodiments.
Figure 8:
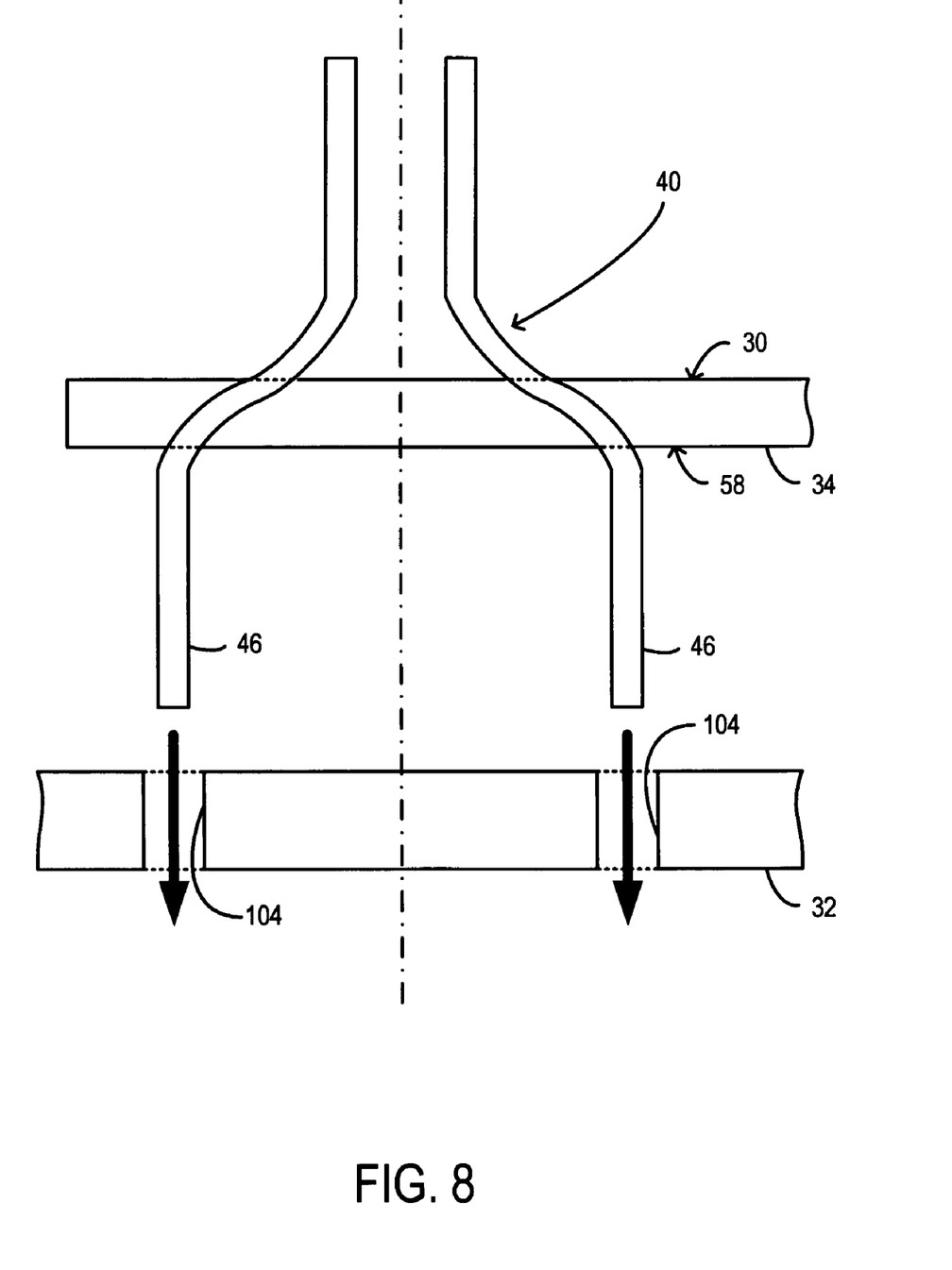
FIGS. 8–11 are partial, schematic, side cross-sectional views showing sequential stages of assembling the apparatus of FIG. 5.

FIG. 7 is a flow chart that illustrates a process for assembling at least a part of the apparatus 70 according to some embodiments. As indicated at 100 in FIG. 7, initially an attachment assembly like the assembly 30 shown in FIGS. 2–4 may be provided. Then, as indicated at 102 in FIG. 7 and as schematically illustrated in FIG. 8, the lower members 46 of the metal inserts 40 of the attachment assembly 30 may be inserted through holes 104 formed in the circuit board 32. (The attachment assembly 30 may have standoffs, which are not shown, on the lower surface 58 of the plastic frame 34 to set a spacing between the circuit board 32 and the plastic frame 34, as shown in FIG. 9.)

Figure 9:
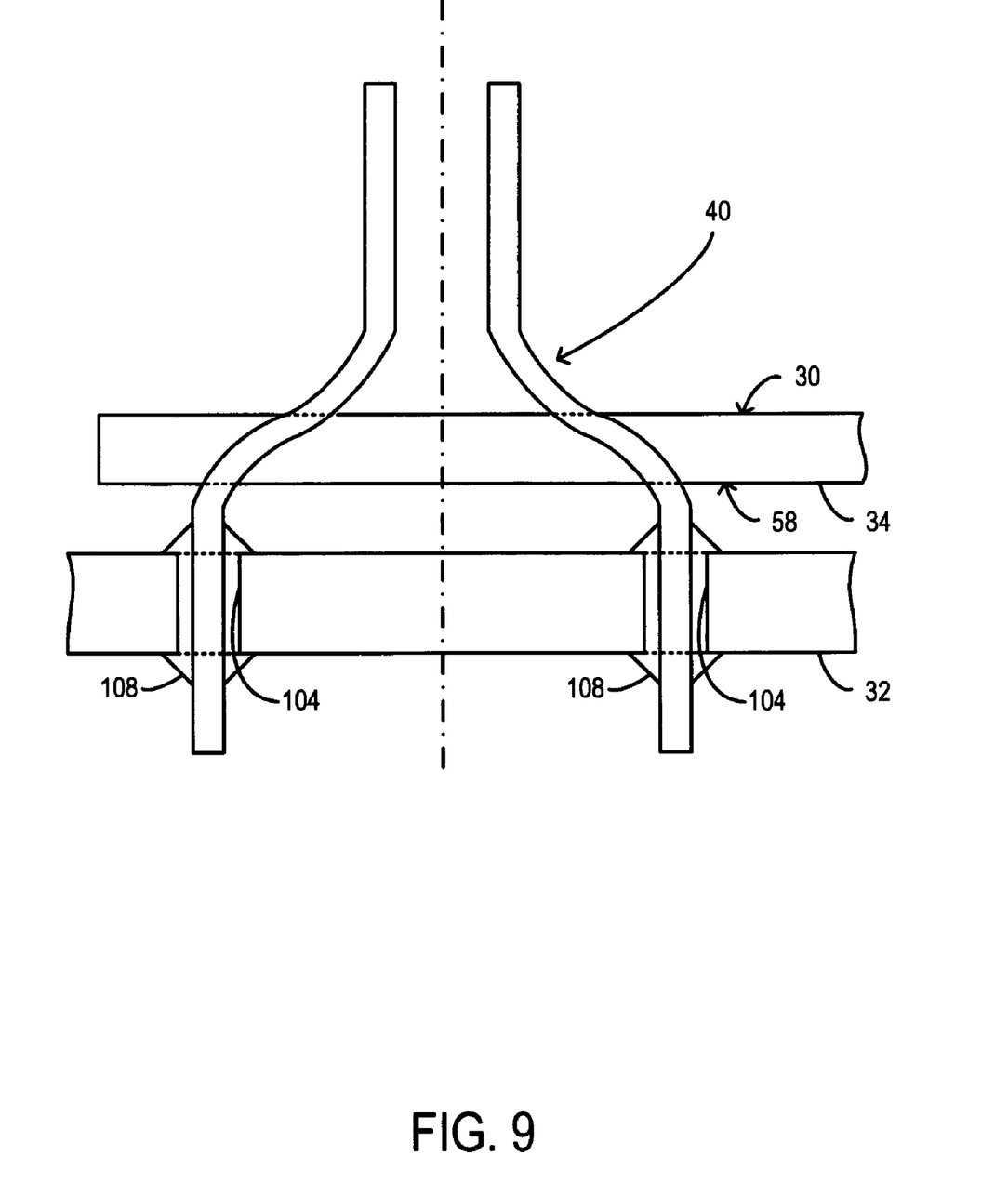

Next, as indicated at 106 in FIG. 7 and as schematically illustrated in FIG. 9, the lower members 46 of the metal inserts 40 may be soldered to the circuit board 32 (solder indicated at 108). The soldering may, for example, be performed in accordance with conventional principles for wave soldering.

Figure 10:
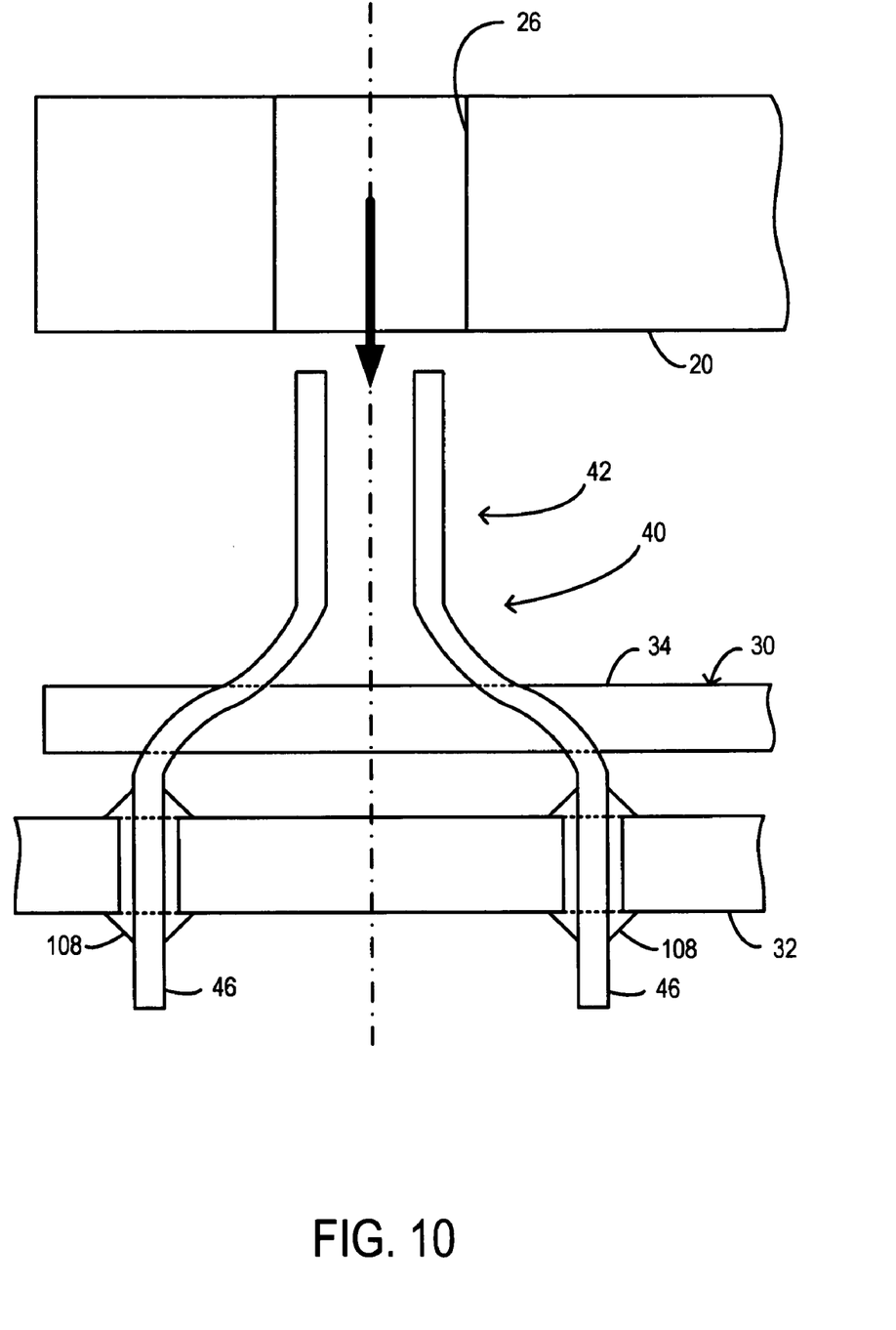

Then, as indicated at 110 in FIG. 7 and as schematically illustrated in FIG. 10, the heat sink 20 may be installed on the metal inserts 40 (only one of which is shown in FIG. 10) in a manner such that the upper portions 42 of the metal inserts 40 are inserted into the mounting holes 26 of the heat sink 20 by lowering the heat sink 20 toward the plastic frame 34 of the attachment assembly 30.

Figure 11:
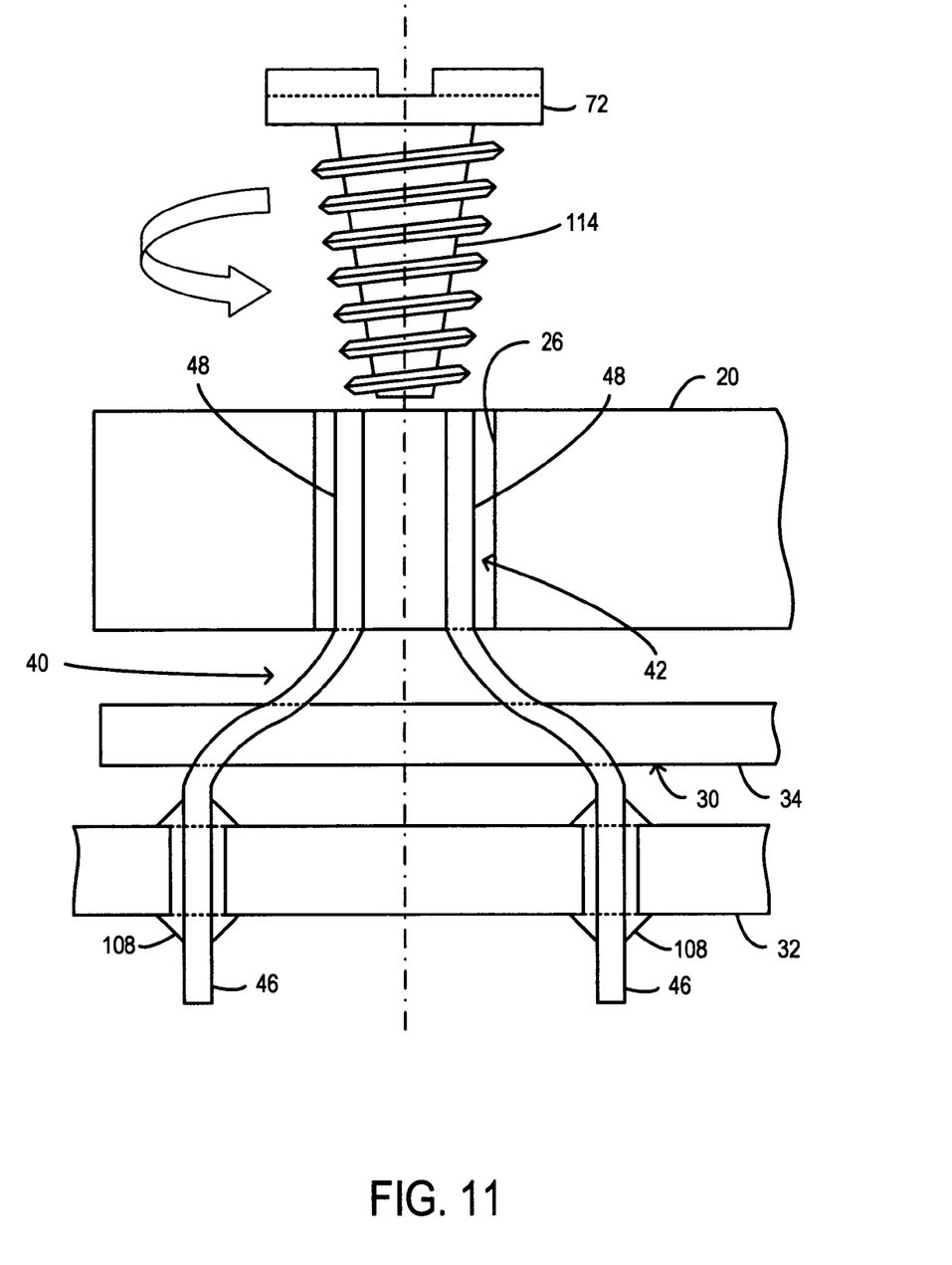

In a subsequent operation to 106 (FIG. 7), as indicated at 112 in FIG. 7 and as schematically illustrated in FIG. 11, a respective fastener 72 may be inserted into the opening 52 (FIG. 3) and driven into the respective upper portion 42 of each of the metal inserts 40 (with the upper portions 42 received within the mounting holes 26 of the heat sink 20) to secure the heat sink 20 to the metal inserts 40. This may be done while holding the heat sink down on an integrated circuit (IC) die 113 (FIG. 13, not shown in FIGS. 8–12). As the fastener 72 is driven into the upper portion 42 of the metal insert 40, the tapered, threaded portion 114 of the fastener 72 swage-forms or expands the upper portion 42 of the metal insert 40 by pushing the barrel segments 48 of the upper portion 42 against the sides of the mounting hole 26 of the heat sink 20. The driving of the fastener 72 may, for example, be performed with a motorized screw driver (not shown) which may be arranged to limit the maximum torque applied by the screw driver to a predetermined torque, such as 20 inch-pounds.

Figure 12:
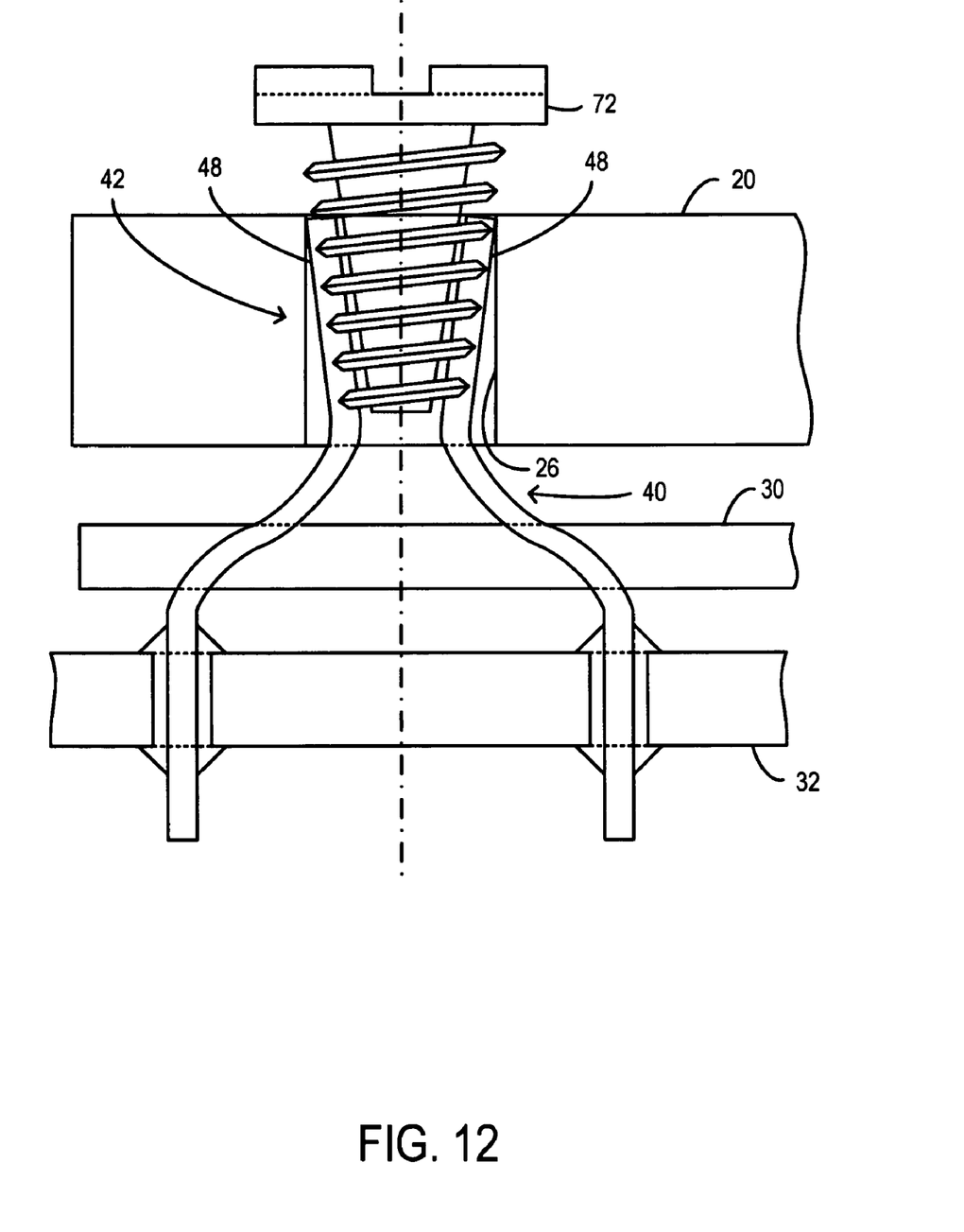
FIG. 12 is a view similar to FIGS. 8–11, showing a detail of the apparatus of FIG. 5 in an assembled condition.

A result of the operation 112 illustrated in FIG. 11 is shown in FIG. 12, wherein the barrel segments 48 of the upper portion 42 of the metal insert 40 are sandwiched between the fastener 72 and the sides of the mounting hole 26 of the heat sink 20. In this way, the heat sink 20 is secured to the metal inserts 40 of the attachment assembly 30, and is secured via the metal inserts 40 to the circuit board 32.

With this heat sink attachment arrangement, the circuit board 32 is effectively stiffened in the region at and around the heat sink 20, which may aid in protecting neighboring devices on the circuit board 32 from damage to their connections to the circuit board 32 in the event of dynamic forces applied to the circuit board during transportation or handling thereof or as a result of thermal cycling. Moreover, the metal inserts may provide a degree of compliance to dynamic forces which also may aid in preventing damage to device connections to the circuit board.

Furthermore, since the attachment assembly 30 may be rather lightweight, formation of reliable and high quality solder joints 108 (FIG. 9) during the soldering operation 106 (FIG. 7) may be promoted.

Figure 13:
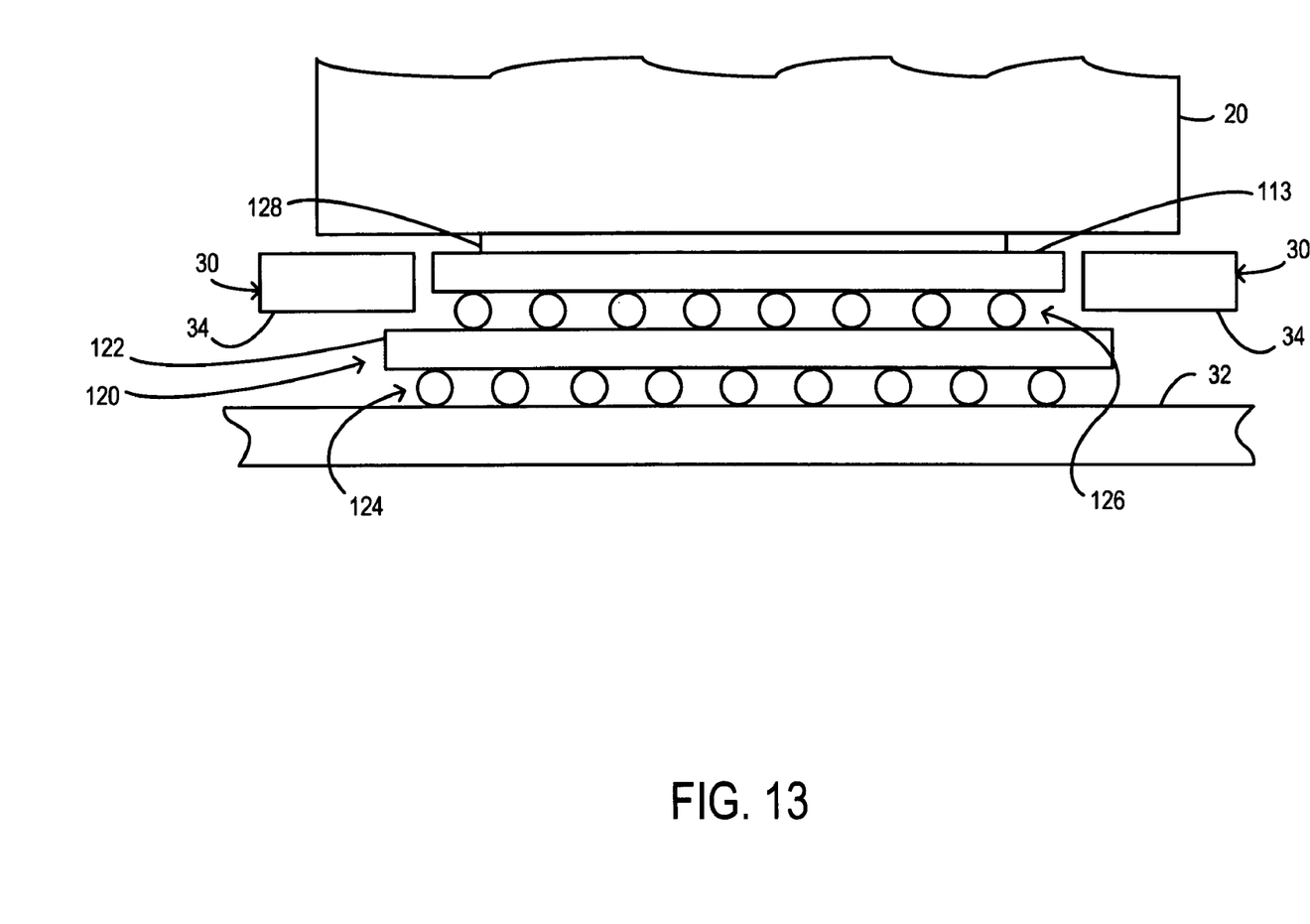
FIG. 13 is another partial schematic side cross-sectional view of the apparatus of FIG. 5.

FIG. 13 is partial schematic side cross-sectional view showing other aspects of the apparatus 70.

As seen from FIG. 13, an IC package 120 is mounted on the circuit board 32. The IC package 120 may include a package substrate 122 connected to the circuit board 32 by a ball grid array (BGA) connector 124 and the IC die 113 connected to the package substrate 122 by another BGA connector 126. The IC die may be thermally coupled to the heat sink 20 via a thermal interface material 128, so that the heat sink 20 may function to cool the IC die 113 during operation of the apparatus 70. Portions of the attachment assembly 30 (and particularly portions of the plastic frame 34) are also shown in cross-section. In some embodiments the IC die 113 may comprise a processor, for example. The circuit board 32 may be the motherboard of a computer.

In some embodiments, the attachment assembly 30 may not be employed, and instead individual ones of metal inserts, not incorporated in an attachment assembly, may be inserted into holes 104 of the circuit board 32 and soldered to the circuit board 32. In other embodiments, two attachment assemblies, each having a pair of metal inserts, may be employed instead of the attachment assembly 30 which includes four metal inserts. However, using the attachment assembly having four metal inserts as illustrated herein may aid in streamlining assembly of the apparatus 70.

The total number of metal inserts employed (and the total number of mounting holes provided in the heat sink) may be more or less than the four metal inserts (and four mounting holes) shown.

Furthermore, in some embodiments, each metal insert may have only one pin-shaped lower member, or may have three or more pin-shaped lower members, rather than the two lower members shown in the drawings. Generally, the shape of the lower members of the metal inserts may be varied from the pin shape that is shown in the drawings.

The fastener 72 need not be a pan head screw. For example, screws having other types of heads may be employed as the fasteners 72.

Although not shown in the drawings, the apparatus 70 may also include other components of a typical electronic device, including for example a chassis in which the circuit board 32 may be mounted, a housing, a power supply, signal interfaces, and so forth.

The several embodiments described herein are solely for the purpose of illustration. The various features described herein need not all be used together, and any one or more of those features may be incorporated in a single embodiment. Therefore, persons skilled in the art will recognize from this description that other embodiments may be practiced with various modifications and alterations.

What is claimed is:

1. An apparatus comprising:
   a circuit board;
   a plurality of metal inserts; and
   a heat sink having a plurality of mounting holes;
   each of the metal inserts including:
      at least one lower member soldered to the circuit board; and
      an upper portion received in a respective one of the mounting holes of the heat sink and secured to the respective one of the mounting holes by a respective fastener;
   wherein each of the fasteners is received within the upper portion of a respective one of the metal inserts; and
   wherein the upper portion of each of the metal inserts is swage-formed by the respective fastener to the respective one of the mounting holes of the heat sink.

2. The apparatus of claim 1, wherein each of the fasteners is a tapered screw.

3. The apparatus of claim 1, wherein the upper portion of each of the metal inserts is held between the respective fastener and the respective one of the mounting holes of the heat sink.

4. An apparatus comprising:
a circuit board;
a plurality of metal inserts; and
a heat sink having a plurality of mounting holes;
each of the metal inserts including:
   at least one lower member soldered to the circuit board; and
   an upper portion received in a respective one of the mounting holes of the heat sink and secured to the respective one of the mounting holes by a respective fastener;
wherein the upper portion of each of the metal inserts includes a pair of barrel segments which together define a substantially cylindrical space in which the respective fastener is received.

5. The apparatus of claim 1, wherein each of the metal inserts includes a pair of lower members soldered to the circuit board.

6. The apparatus of claim 1, wherein the plurality of metal inserts includes four metal inserts.

7. The apparatus of claim 6, further comprising:
a substantially rectangular plastic frame between the circuit board and the heat sink, the frame having four corners, a respective one of the four metal inserts being mounted at each of the four corners of the frame.

8. An article of manufacture comprising:
a substantially rectangular plastic frame having four corners;
four metal inserts each mounted at a respective one of the four corners of the frame, each of the metal inserts including:
   at least one pin-shaped lower member to be soldered to a circuit board; and
   an upper portion to be secured to a heat sink.

9. The article of claim 8, wherein the upper portion of each of the metal inserts includes a pair of barrel segments which together define a substantially cylindrical space.

10. The article of claim 9, wherein each of the metal inserts includes a pair of pin-shaped lower members.

11. A method comprising:
soldering a plurality of metal inserts to a circuit board;
installing a heat sink on the soldered metal inserts such that a respective upper portion of each of the metal inserts is inserted into a respective mounting hole of the heat sink; and
driving a respective screw into the respective upper portion of each of the metal inserts to secure the heat sink to the metal inserts.

12. The method of claim 11, further comprising:
before the soldering of the metal inserts, inserting at least one pin-shaped lower member of each of the metal inserts into a respective hole in the circuit board.

13. The method of claim 12, wherein the soldering of the metal inserts includes wave soldering.

14. The method of claim 11, wherein the plurality of metal inserts includes four metal inserts.

15. The method of claim 14, wherein the four metal inserts are mounted in a substantially rectangular plastic frame before the soldering of the metal inserts, each of the four metal inserts being located at a respective corner of the frame.

16. A system comprising:
a circuit board;
a processor mounted on the circuit board;
a plurality of metal inserts; and
a heat sink that is thermally coupled to the processor, the heat sink having a plurality of mounting holes;
each of the metal inserts including:
   at least one lower member soldered to the circuit board; and
   an upper portion received in a respective one of the mounting holes of the heat sink and secured to the respective one of the mounting holes by a respective fastener;
wherein the plurality of metal inserts includes four metal inserts.

17. The system of claim 16, wherein each of the fasteners is received within the upper portion of a respective one of the metal inserts.

18. The system of claim 17, wherein the upper portion of each of the metal inserts is swage-formed by the respective fastener to the respective one of the mounting holes of the heat sink.

19. The system of claim 18, wherein each of the fasteners is a tapered screw.

20. The system of claim 17, wherein the upper portion of each of the metal inserts is held between the respective fastener and the respective one of the mounting holes of the heat sink.

21. The system of claim 16, wherein the upper portion of each of the metal inserts includes a pair of barrel segments which together define a substantially cylindrical space in which the respective fastener is received.

22. The system of claim 16, wherein each of the metal inserts includes a pair of lower members soldered to the circuit board.

23. The system of claim 16, further comprising:
a substantially rectangular plastic frame between the circuit board and the heat sink, the frame having four corners, a respective one of the four metal inserts being mounted at each of the four corners of the frame.

* * * * *